US012587767B2

(12) United States Patent
Yoon

(10) Patent No.: US 12,587,767 B2
(45) Date of Patent: Mar. 24, 2026

(54) RAMP SIGNAL GENERATOR AND IMAGE SENSOR AND ELECTRONIC DEVICE INCLUDING THE SAME

(71) Applicant: SAMSUNG ELECTRONICS CO., LTD., Suwon-si (KR)

(72) Inventor: Younghyun Yoon, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 39 days.

(21) Appl. No.: 18/900,069

(22) Filed: Sep. 27, 2024

(65) Prior Publication Data

US 2025/0119668 A1 Apr. 10, 2025

(30) Foreign Application Priority Data

Oct. 5, 2023 (KR) ........................ 10-2023-0132704

(51) Int. Cl.
H04N 25/78 (2023.01)
H03K 4/90 (2006.01)
H03M 1/56 (2006.01)

(52) U.S. Cl.
CPC .............. H04N 25/78 (2023.01); H03K 4/90 (2013.01); H03M 1/56 (2013.01)

(58) Field of Classification Search
None
See application file for complete search history.

(56) References Cited

U.S. PATENT DOCUMENTS

| | | |
|---|---|---|
| 9,521,344 B2 | 12/2016 | Lee et al. |
| 10,805,568 B2 | 10/2020 | Kim |
| 10,819,935 B2 | 10/2020 | Kim et al. |
| 10,987,421 B2 | 4/2021 | Cho |
| 11,032,505 B2 | 6/2021 | Kim et al. |
| 11,552,647 B2 | 1/2023 | Sakai et al. |
| 2021/0067724 A1* | 3/2021 | Iwata .................. H03M 1/1295 |
| 2024/0137672 A1* | 4/2024 | Han ........................ H04N 25/78 |
| 2024/0179434 A1* | 5/2024 | Han ........................ H04N 25/78 |
| 2025/0097606 A1* | 3/2025 | Ichihashi .............. H04N 25/78 |

FOREIGN PATENT DOCUMENTS

CN 115379143 A 11/2022

OTHER PUBLICATIONS

Sackinger et al., "A High-Swing, High-Impedance MOS Cascode Circuit", IEEE Journal of Solid-State Circuits, vol. 25, No. 1, Feb. 1990, pp. 289-298 (10 pages total).

* cited by examiner

*Primary Examiner* — Paul M Berardesca
(74) *Attorney, Agent, or Firm* — Sughrue Mion, PLLC

(57) ABSTRACT

A ramp signal generator includes a resistor connected between an output node outputting a ramp signal that increases or decreases at a constant slope and a first power node which receives a first power voltage, and plural current cells. A cell current flows through each of the current cells to the first power node or the resistor. The current cells include a first current cell. The first current cell includes a first transistor connected between a first switching node and the output node, the cell current flowing to the resistor through the first transistor, a second transistor connected between the first switching node and the first power node, the cell current flowing to the first power node through the second transistor, and a negative feedback circuit that maintains a constant voltage at the first switching node.

20 Claims, 20 Drawing Sheets

(Reset Phase)

(Set Phase)

FIG. 7A

RAMP SIGNAL GENERATOR AND IMAGE SENSOR AND ELECTRONIC DEVICE INCLUDING THE SAME

CROSS-REFERENCE TO RELATED APPLICATION

This application is based on and claims priority under 35 U.S.C. § 119 to Korean Patent Application No. 10-2023-0132704, filed on Oct. 5, 2023, in the Korean Intellectual Property Office, the disclosure of which being incorporated by reference herein in its entirety.

BACKGROUND

Apparatuses and devices consistent with the present disclosure relate to a semiconductor circuit, and more particularly, to a ramp signal generator that generates a ramp signal of which a level increases or decreases at a certain slope and an image sensor and electronic device including the same.

A ramp signal is a signal whose level increases or decreases at a constant slope. An electronic device may detect data using a ramp signal. For example, in an image sensor, an analog-to-digital converter may convert a pixel signal into a digital value by sampling, on a ramp signal, a pixel signal generated in response to a photo-charge generated by a photo-sensitive based device. Linearity of the ramp signal is required for accuracy of data detection.

SUMMARY

It is an aspect to provide a ramp signal generator with improved integral non-linearity (INL) performance and an image sensor and an electronic device including the same.

According to an aspect of one or more embodiments, there is provided a ramp signal generator comprising a resistor connected between an output node outputting a ramp signal that increases or decreases at a constant slope and a first power node which is configured to receive a first power voltage; and a plurality of current cells, a cell current flowing through each of the plurality of current cells to the first power node or the resistor, the plurality of current cells including at least one first current cell. The at least one first current cell comprises a first transistor connected between a first switching node and the output node, the cell current flowing to the resistor through the first transistor; a second transistor connected between the first switching node and the first power node, the cell current flowing to the first power node through the second transistor; and a negative feedback circuit that maintains a constant voltage at the first switching node by controlling a gate terminal of the first transistor based on a voltage of the first switching node.

According to another aspect of one or more embodiments, there is provided an image sensor comprising a pixel array including a plurality of pixels; a ramp signal generation circuit configured to generate a ramp signal of which a level decreases at a constant slope; and an analog-to-digital conversion circuit configured to convert a pixel signal provided from the pixel array into a pixel value based on the ramp signal. The ramp signal generation circuit includes a load resistor connected between a ground and an output node to which the ramp signal is output, and a plurality of current cells, each providing a cell current to the load resistor during a reset period and providing the cell current to the ground during a set period. Each of the plurality of current cells includes a first transistor connected between a switching node and the output node, the cell current flowing to the load resistor through the first transistor, a second transistor connected between the switching node and the ground, the cell current flowing to the ground through the second transistor, and a negative feedback circuit that controls a gate terminal of the first transistor based on a voltage of the switching node so that the first transistor operates in a saturation region.

According to yet another aspect of one or more embodiments, there is provided an electronic device comprising a ramp signal generator that includes a plurality of current cells and a load resistor, the ramp signal generator being configured to control the plurality of current cells to reduce an amount of current flowing through the load resistor and to generate a ramp signal of which a level increases or decreases at a certain slope; and a main circuit configured to perform at least one predefined function by detecting data based on the ramp signal. Each of the plurality of current cells includes a first transistor connected between a switching node and an output node, a cell current flowing to the load resistor through the first transistor during a reset period, a second transistor connected between the switching node and a ground, the cell current flowing to the ground through the second transistor during a set period, and a negative feedback circuit that controls a gate terminal of the first transistor based on a voltage of the switching node so that the first transistor operates in a saturation region.

BRIEF DESCRIPTION OF THE DRAWINGS

Various embodiments will be more clearly understood from the following detailed description taken in conjunction with the accompanying drawings, in which:

FIG. 7A is a circuit diagram showing an operation of a ramp signal generator including current cells according to a Comparative Example.

DETAILED DESCRIPTION

Hereinafter, various embodiments will be described in detail with reference to the accompanying drawings.

Figure 1:
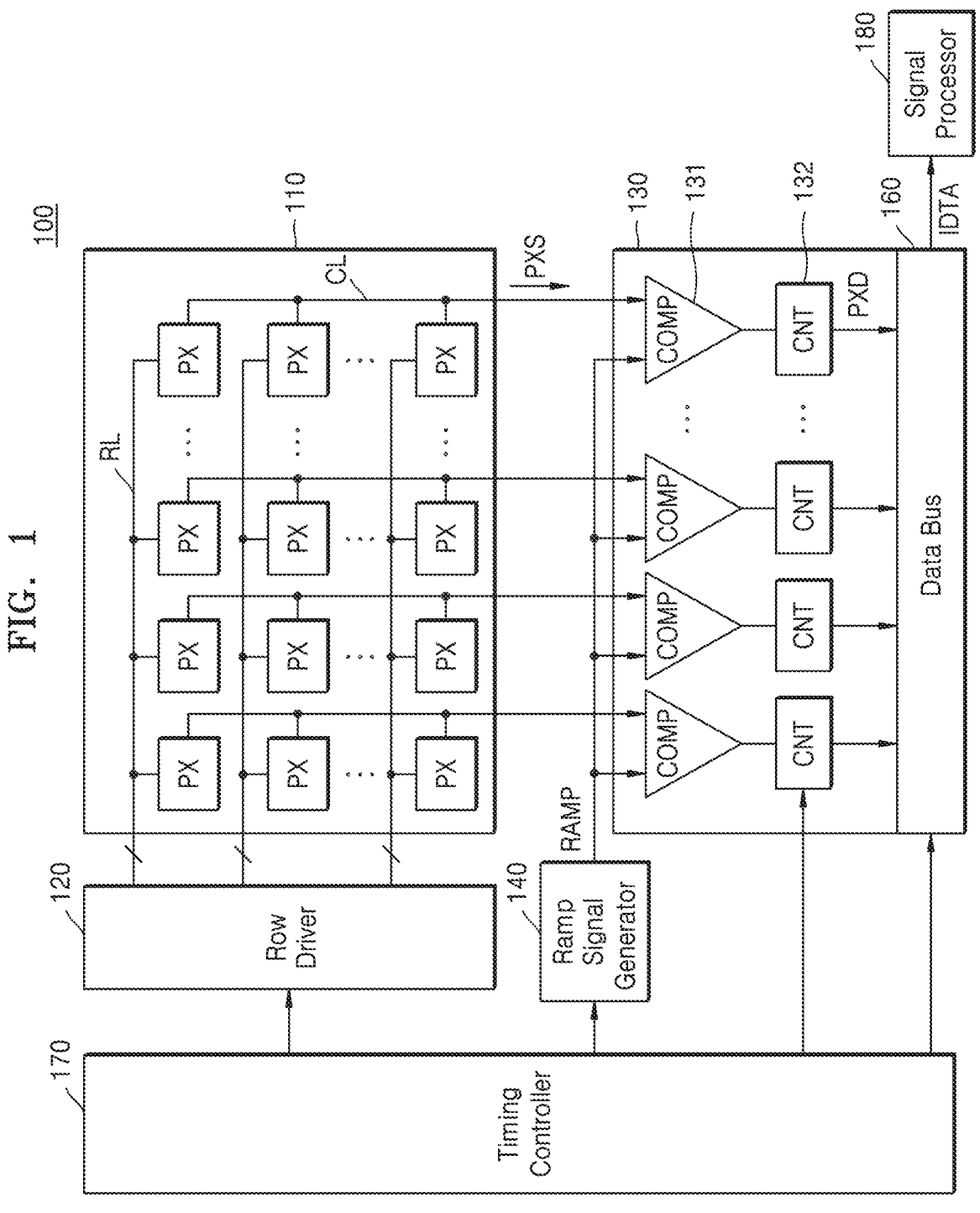
FIG. 1 is a block diagram illustrating an image sensor according to an embodiment.

FIG. 1 is a block diagram illustrating an image sensor 100 according to an embodiment.

Referring to FIG. 1, the image sensor 100 may be mounted in an electronic device having an image or light sensing function. For example, the image sensor 100 may be mounted on electronic devices such as cameras, smartphones, wearable devices, Internet of Things (IoT) devices, home appliances, tablet personal computers (tablet PCs), personal digital assistants (PDAs), portable multimedia players (PMPs), navigation, drones, advanced drivers assistance systems (ADASs), and the like. In some embodiments, the image sensor 100 may be mounted on an electronic device provided as a component in vehicles, furniture, manufacturing facilities, doors, various measuring devices, and the like.

Referring to FIG. 1, the image sensor 100 may include a pixel array 110, a row driver 120, an analog-to-digital conversion (ADC) circuit 130, a ramp signal generator 140, a data bus 160, a timing controller 170, and a signal processor 180. The row driver 120, the ADC circuit 130, and the ramp signal generator 140 may be referred to as a readout circuit.

The pixel array 110 includes a plurality of row lines RL, a plurality of column lines CL, and a plurality of pixels PX connected to the plurality of row lines RL and the plurality of column lines CL and arranged in rows and columns. In some embodiments, the plurality of pixels PX may be active pixel sensors (APS).

In an embodiment, pixels PX arranged in the same columns may be connected to the same column lines CL. However, the embodiments are not limited thereto, and depending on the arrangement of the pixels PX, pixels PX arranged in the same columns may be connected to different column lines CL. Each of the pixels PX may output a pixel signal PXS (e.g., a pixel voltage) through a corresponding column line CL.

Each of the pixels PX may detect light using a photoelectric conversion device and output an image signal that is an electrical signal according to the detected light. The photoelectric conversion device may be a photo-sensing device made of an organic material or an inorganic material, such as a photodiode (inorganic photodiode), an organic photo film, a perovskite photodiode, a photo transistor, a photo gate, or a pinned photodiode. Hereinafter, a photodiode as a photoelectric conversion element will be described as an example.

A microlens for condensing may be arranged above each of the plurality of pixels PX, or above each of pixel groups composed of adjacent pixels PX. A color filter for transmitting light in a specific spectrum region may be arranged above each of the plurality of pixels PX, and each of the plurality of pixels PX may detect light in the specific spectrum region from light received through a microlens based on a corresponding color filter. For example, the pixel array 110 may include red pixels for converting light in a red spectrum region into an electrical signal, green pixels for converting light in a green spectrum region into an electrical signal, and blue pixels for converting light in a blue spectrum region into an electrical signal. However, the embodiments are not limited thereto, and the pixel array 110 may further include white pixels, or the pixel array 110 may include pixels according to different color combinations, such as cyan pixels, yellow pixels, green pixels, and magenta pixels.

In an embodiment, the pixels PX may operate in a plurality of conversion gain modes. For example, the pixels PX may operate in a high conversion gain (HCG) mode and may operate in a low conversion gain (LCG) mode. The pixel PX may output an HCG pixel signal (a reset signal and image signal) in the HCG mode, and output an LCG pixel signal (a reset signal and image signal) in the LCG mode.

In an embodiment, the pixels PX may operate in the HCG mode under a low illuminance environment and in the LCG mode under a high illuminance environment. In an embodiment, the pixels PX may operate in the HCG mode in a first frame and in the LCG mode in a second frame continuous with the first frame. In an embodiment, the pixels PX may operate in the HCG mode and the LCG mode in a time-division manner within one frame.

In an embodiment, the pixels PX may include a plurality of photodiodes, for example, a first photodiode and a second photodiode. Light-receiving areas of the plurality of photodiodes may be the same or different. In an embodiment, the pixels PX may have a pixel structure in which a plurality of photodiodes share a floating diffusion node.

The row driver 120 drives the pixel array 110 in one or a plurality of row units. The row driver 120 may decode a row control signal (e.g., a row address) received from the timing controller 170 and select at least one row to be read out from among a plurality of rows of the pixel array 110 in response to the decoded row control signal.

The row driver 120 may provide control signals, for example, selection signals, transmission control signals, conversion control signals, switching signals, and the like, to the selected at least one row through the row lines RL. The pixels PX included in the pixel row selected by the selection signal provided from the row driver 120 output pixel signals, for example, pixel voltages.

The ramp signal generator 140 (also referred to as a ramp signal generation circuit) may generate a ramp signal RAMP (or a ramp voltage) in which the level increases (up) or decreases (down) at a constant slope. The slope of the ramp signal RAMP may vary according to an analog gain setting. The ramp signal RAMP may be provided as a reference voltage to the ADC circuit 130.

Figure 2:
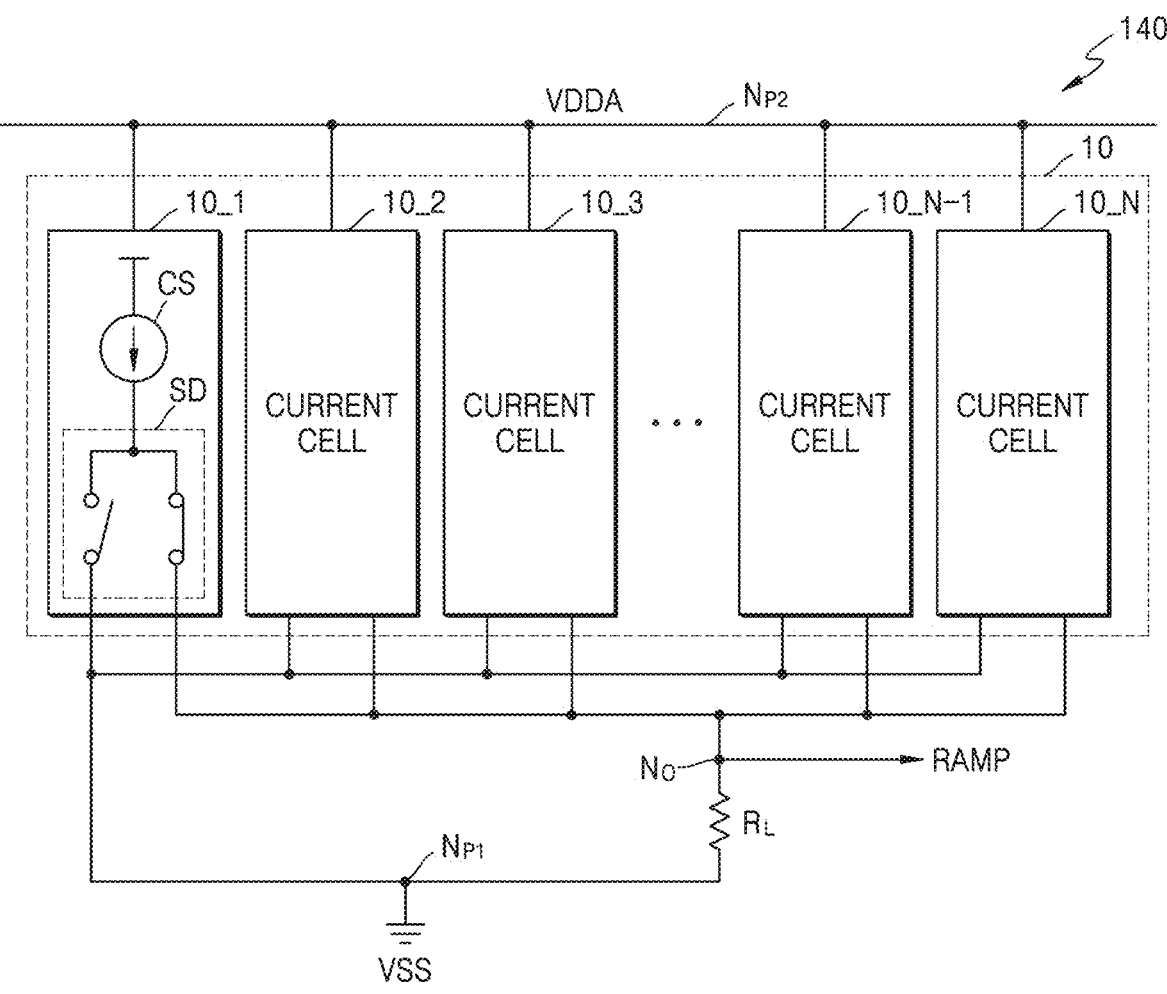
FIG. 2 is a circuit diagram illustrating a ramp signal generator according to an embodiment.

The ramp signal generator 140 according to an embodiment may include a plurality of current cells and a load resistor (see FIG. 2). The ramp signal generator 140 may further include a bias circuit (not shown) for driving the plurality of current cells. Each of the plurality of current cells may generate a cell current, flow the cell current to a load resistor, or flow the cell current to a first power node provided with a first power voltage (e.g., a ground voltage). The plurality of current cells may include a switch transistor configured to provide a cell current to a load resistor. In some embodiments, the plurality of current cells may include a negative feedback circuit configured to constantly maintain a voltage of the switching node by controlling a gate voltage of the switch transistor based on a voltage of a first terminal of the switch transistor, for example, a voltage of a switching node, such that the switch transistor operates in a saturation region. In an embodiment, the negative feedback circuit may be implemented as a single-stage amplifier. Since the switch transistor always operates in the saturation region, the voltage of the switching node may not be changed even if the voltage of the output node from which the ramp signal is output changes. Details of the ramp signal generator 140 will be described later with reference to FIGS. 2 to 12.

The ADC circuit 130 may convert a plurality of pixel signals PXS (e.g., a plurality of pixel voltages) provided from the pixel array 110 into a plurality of pixel values based on the ramp signal RAMP provided from the ramp signal generator 140. The ADC circuit 130 may include a plurality of comparators (COMP) 131 and a plurality of counters (CNT) 132. In an embodiment, the ADC circuit 130 may further include a plurality of buffers (not shown) for buffering the ramp signal RAMP.

The ADC circuit 130 may convert each of the plurality of pixel signals PXS into a pixel value in a correlated double sampling (CDS) method, and a plurality of comparators (COMP) 131 may be referred to as a CDS circuit. Each of the plurality of comparators (COMP) 131 may compare the pixel signal PXS received through the column line CL with the ramp signal RAMP and output a comparison result signal. When the ramp signal RAMP whose level decreases by a specific slope becomes the same as the pixel signal PXS or is less than the pixel signal PXS, the comparator (COMP) 131 may output a comparison result signal transitioning from a first level (e.g., logic high) to a second level (e.g., logic low).

The comparator (COMP) 131 may sample and hold a reset signal provided from the pixel PX according to a correlated double sampling (CDS) method, and may sample a signal obtained by adding a reset signal to an image signal received from the pixel PX. The comparator (COMP) 131 may output a first comparison result signal corresponding to the reset signal and output a second comparison result signal corresponding to the image signal.

The counter (CNT) 132 may generate a pixel signal obtained by subtracting the reset signal from the image signal by counting a period up to a time point when the comparison result signal output from the comparator (COMP) 131 transitions from a first level to a second level. In an embodiment, the counter (CNT) 132 may generate a reset value by counting the first comparison result signal, generate an image value by counting the second comparison result signal, and generate a pixel value PXD by subtracting the reset value from the image value.

The data bus 160 may temporarily store the pixel values PXD received from the ADC circuit 130 and then output the pixel values PXD to the signal processor 180 (or an external device of the image sensor 100, for example, an application processor). In an embodiment, the data bus 160 may provide pixel values to the signal processor 180 in units of at least one line of the pixel array 110. The data bus 160 may include a plurality of column memories and a column decoder, and a plurality of pixel values stored in the plurality of column memories may be output as image data IDTA under the control of the column decoder.

The timing controller 170 may control the operation and operation timing of the row driver 120, the ADC circuit 130, the ramp signal generator 140 and the data bus 160 by outputting a timing control signal to each of the row driver 120, the ADC circuit 130, the ramp signal generator 140, and the data bus 160.

The signal processor 180 may perform image processing on the received image data IDTA. For example, the signal processor 180 may change the data pattern of pixel values of the received image data IDTA (e.g., change raw data to RGB pattern), or perform signal processing for the received image data IDTA, such as one or more of noise reduction processing, gain control, waveform shaping processing, interpolation processing, white balance processing, gamma processing, edge emphasis processing, binning, downsizing, image quality compensation, etc. The image quality compensation may include signal processing such as one or more of black level compensation, lens shading compensation, crosstalk compensation, and bad pixel compensation. In an embodiment, the signal processor 180 may generate a high dynamic range (HDR) image by merging first image data and second image data having different luminance.

The image data IDTA processed by the image signal processor 180 may be transmitted to an external processor. For example, the external processor may be a host processor of an electronic device on which the image sensor 100 is mounted. For example, the external processor may be an application processor of a mobile terminal. The image sensor 100 may transmit image data IDTA to an external processor according to a data communication method based on a set interface, for example, a mobile industry processor interface (MIPI). The external processor may perform image processing on the received image data IDTA. In an embodiment, the external processor may receive first image data and second image data having different luminance as image data IDTA, and generate an HDR image by merging the first image data and the second image data.

When the switch transistor operates in a triode region at the beginning of a ramping period in which the ramp signal generator 140 performs a ramping operation, the voltage of the switching node may change according to the change of the ramp signal, and the change of the voltage of the switching node may cause an error in the ramp signal, thereby deteriorating the integral non-linearity (INL) characteristics of the ramp signal. In other words, the linearity of the ramp signal may deteriorate at the beginning of the ramping period.

However, in the ramp signal generator 140 according to some embodiments, the switch transistor of the current cell operates in the saturation region even at the beginning of the ramping period, so that the voltage of the switching node does not change even if the ramp signal changes. Accordingly, the INL characteristics of the ramp signal may be improved. As the INL characteristics of the ramp signal are improved, even if the image sensor 100 operates at a high speed, deterioration of the image quality of the generated image may be prevented.

FIG. 2 is a circuit diagram illustrating a ramp signal generator 140 according to an embodiment.

Referring to FIG. 2, the ramp signal generator 140 may include a plurality of current cells 10 and a load resistor $R_L$. The ramp signal generator 140 may further include a bias circuit that provides bias voltages for driving the plurality of current cells 10.

The load resistor $R_L$ may be connected between the output node $N_O$ from which the ramp signal RAMP is output and a first power node $N_{P1}$. A first power supply voltage VSS may be applied to the first power node $N_{P1}$. In an embodiment, the first power voltage VSS may be a ground voltage, and the first power node $N_{P1}$ may be referred to as a ground or a ground node.

The plurality of current cells 10 may include first to Nth current cells 10_1 to 10_N where N is a positive integer equal to or greater than 5, and the first to Nth current cells may generate the same cell current. Each of the first to Nth current cells 10_1 to 10_N may include a current source CS and switching elements SD. Each of the plurality of current cells 10 may be connected to the first power node $N_{P1}$, a second power node $N_{P2}$, and an output node $N_O$. A second power voltage VDDA different from the first power voltage VSS may be applied to the second power node $N_{P2}$. In an embodiment, the second power voltage VDDA may be higher than the first power voltage VSS. Hereinafter, description will be made on the assumption that the second power voltage VDDA is higher than the first power voltage VSS (e.g., a ground voltage). However, the embodiments are not limited thereto, and in some embodiments, a voltage of the first power node $N_{P1}$ may be higher than a voltage of the second power node $N_{P2}$. In the description that follows, a current cell will be referred to as a current cell 10 in situations where there is no need to distinguish amount individual ones of the first to Nth current cells 10_1 to 10_N.

The switching elements SD may provide a cell current generated in the current cell 10 to the load resistor $R_L$ or the first power node $N_{P1}$. The switching elements SD may be implemented with at least two transistors, for example, one of the at least two transistors may be turned on to provide the cell current to the load resistor $R_L$, and the other one of the at least two transistors may be turned on to provide the cell current to the first power node $N_{P1}$. The current cell 10 may provide the cell current to the load resistor $R_L$ during a reset phase (or a reset period), and may provide the cell current to the first power node $N_{P1}$ during a set phase (or a set period).

The current source CS may generate a cell current or a bias current used to generate the cell current.

When the ramp signal generator 140 performs a ramping operation, the plurality of current cells 10 may be sequentially changed from a reset phase to a set phase, and accordingly, the amount of current flowing through the load resistor $R_L$ may be reduced, thereby reducing the level of the ramp signal RAMP.

At least one of the plurality of current cells 10 may be implemented as a first current cell according to embodiments (see FIGS. 3A and 3B), and the first current cell may include a negative feedback circuit that maintains a voltage of the switching node constant. In some embodiments, all of the plurality of current cells 10 may be implemented as the first current cell.

Figure 3A:
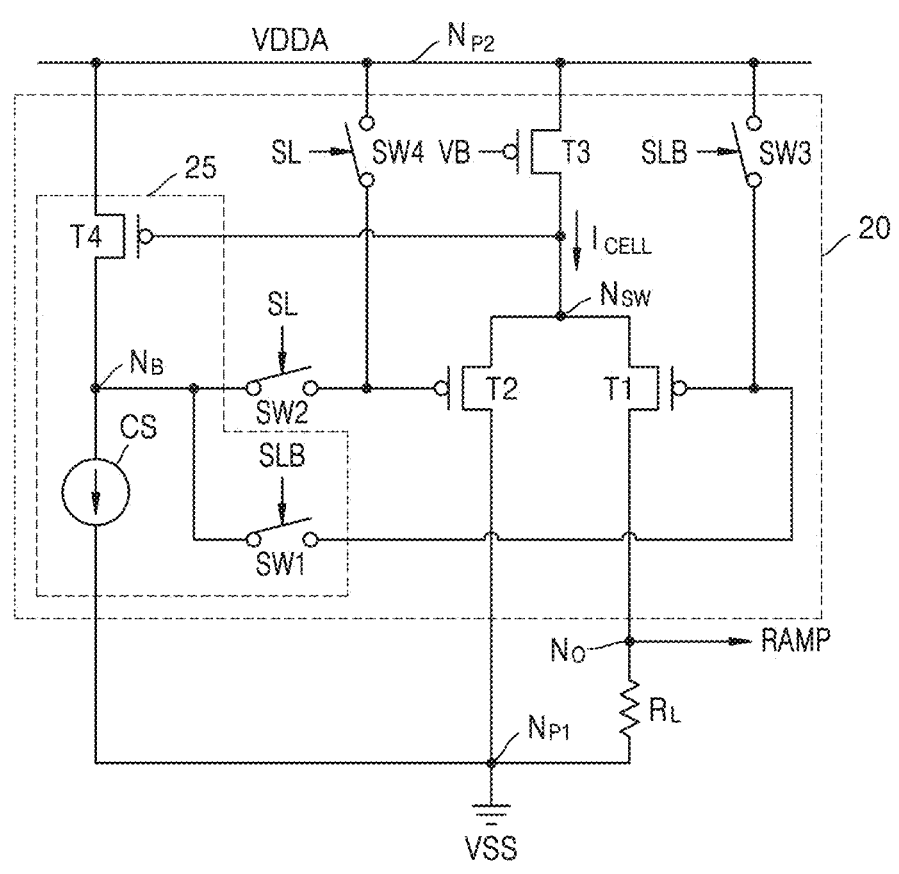
FIGS. 3A and 3B are circuit diagrams illustrating a current cell according to an embodiment.
Figure 3B:
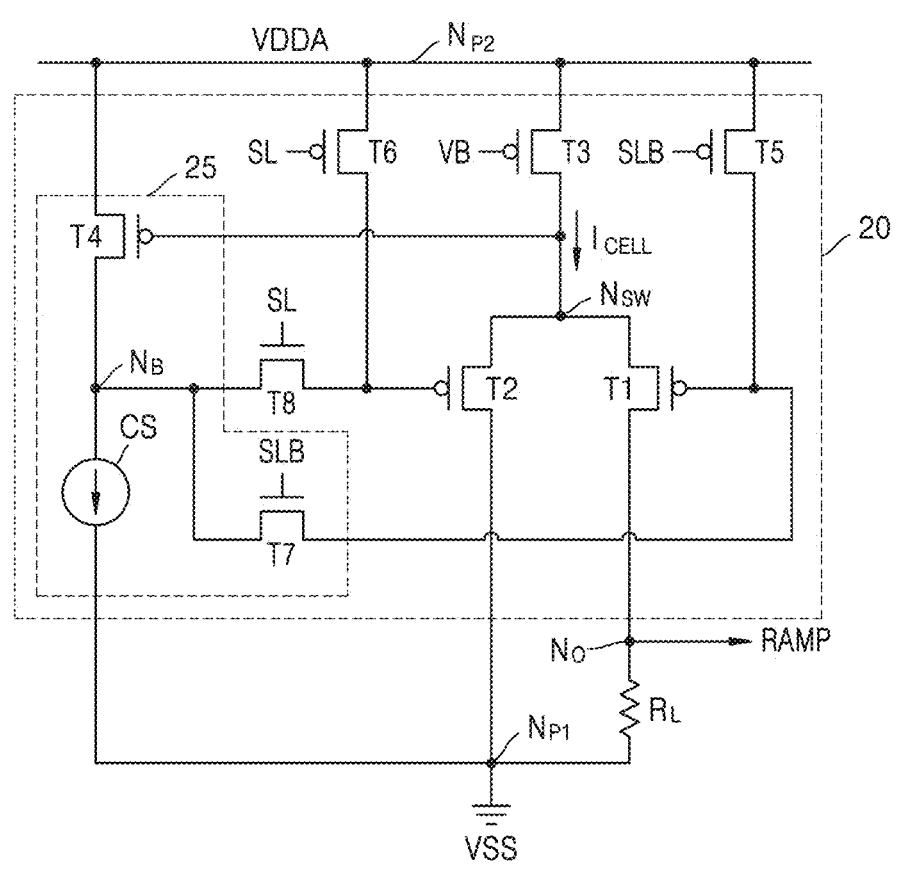

FIGS. 3A and 3B are circuit diagrams illustrating a first current cell according to an embodiment.

Referring to FIG. 3A, a first current cell 20 may include a current source CS, a first transistor T1, a second transistor T2, a third transistor T3, a fourth transistor T4, and a plurality of switches, for example, including a first switch SW1, a second switch SW2, a third switch SW3, and a fourth switch SW4. In an embodiment, the first to fourth transistors T1 to T4 may be implemented as P-type transistors (e.g., P-type metal oxide semiconductor field effect transistors (MOSFETs). In an embodiment, the first to fourth switches SW1 to SW4 may be implemented as transistors. For example, as shown in FIG. 3B, the first and second switches SW1 and SW2 may be implemented with P-type transistors and, for example, may be implemented with a seventh transistor T7 and an eighth transistor T8 respectively; the third and fourth switches SW3 and SW4 may be implemented with N-type transistors and, for example, may be implemented by a fifth transistor T5 and a sixth transistor T6 respectively. However, the embodiments are not limited thereto, and in some embodiments, the first and second switches SW1 and SW2 may be implemented as N-type transistors, and the third and fourth switches SW3 and SW4 may be implemented as P-type transistors. In an embodiment, the first to fourth switches SW1 to SW4 may be implemented as transmission gates.

Hereinafter, referring to FIG. 3B, it is assumed that the first and second switches SW1 and SW2 are implemented as P-type transistors, and the third and fourth switches SW3 and SW4 are implemented as N-type transistors as described above.

The first transistor T1 and the second transistor T2 may be referred to as a first switch transistor and a second switch transistor, respectively. The first transistor T1 is connected between the switching node $N_{SW}$ and the output node $N_O$, and may be turned on to provide a cell current to the load resistor $R_L$. For example, the first transistor T1 may be turned on to flow a cell current to the resistance resistor $R_L$ such that the cell current flows to the resistance resistor $R_L$ through the first transistor T1. The second transistor T2 is connected between the switching node $N_{SW}$ and the first power node $N_{P1}$, and may be turned on to provide a cell current to the first power node $N_{P1}$, i.e., the ground. For example, the second transistor T2 may be turned on to directly flow the cell current to the first power node $N_{P1}$ such that the cell current flows to the first power node $N_{P1}$ through the second transistor T2.

The third transistor T3 may be referred to as a bias transistor, and may be connected between the second power node $N_{P2}$ and the switching node $N_{SW}$. The second power supply voltage VDDA may be applied to a first terminal of the third transistor T3. In other words, the first terminal of the third transistor T3 may be configured to receive the second power supply voltage VDDA. The third transistor T3 may generate the cell current $I_{CELL}$ based on a bias voltage VB.

The fifth to eighth transistors T5 to T8 are control transistors for controlling the first and second transistors T1 and T2. The fifth transistor T5 is connected between the second power node $N_{P2}$ and the gate terminal of the first transistor T1, and may be turned on or off in response to a first control signal SLB. The fifth transistor T5 may be turned on in response to the first control signal SLB of a first level (e.g., a low level) to apply a second power voltage VDDA to the gate terminal of the first transistor T1. The first transistor T1 may be turned off in response to the second power supply voltage VDDA applied to the gate terminal.

The sixth transistor T6 is connected between the second power node $N_{P2}$ and the gate terminal of the second transistor T2, and may be turned on or off in response to a second control signal SL. The second control signal SL is a complementary signal of the first control signal SLB. The sixth transistor T6 may be turned on in response to the second control signal SL of the first level (e.g., a low level) to apply the second power voltage VDDA to the gate terminal of the second transistor T2. The second transistor T2 may be turned off in response to the second power supply voltage VDDA applied to the gate terminal.

The seventh transistor T7 is connected between the bias node $N_B$ and the gate terminal of the first transistor T1, and may be turned on or off in response to the first control signal SLB. The seventh transistor T7 may be turned on in response to the first control signal SLB of a second level (e.g., a high level) to provide the voltage of the bias node $N_B$ to the gate terminal of the first transistor T1. The first transistor T1 may be turned on based on the voltage of the bias node $N_B$ to provide the cell current $I_{CELL}$ to the load resistor $R_L$.

The eighth transistor T8 is connected between the bias node $N_B$ and the gate terminal of the second transistor T2, and may be turned on or off in response to the second control signal SL. The eighth transistor T8 may be turned on in response to the second control signal SL of the second level (e.g., a high level) to provide the voltage of the bias node $N_B$ to the gate terminal of the second transistor T2. The second transistor T2 may be turned on based on the voltage of the bias node $N_B$ to provide the cell current $I_{CELL}$ to the first power node $N_{P1}$.

The fourth transistor T4 and the current source CS may operate as a single-stage amplifier. The fourth transistor T4 may be connected between the second power node $N_{P2}$ and the bias node $N_B$, and the gate terminal may be connected to the switching node $N_{SW}$. The current source CS is connected between the bias node $N_B$ and the first power node $N_{P1}$ and may generate a bias current. In some embodiments, the fourth transistor T4 and the current source CS operating as a single-stage amplifier are controlled based on the voltage of the switching node $N_{SW}$. In some embodiments, the voltage of the bias node $N_B$ may be provided as the output of a single-stage amplifier to the gate terminal of the first transistor.

The fourth transistor T4, the current source CS, and the seventh transistor T7 may operate as a negative feedback circuit 25. The fourth transistor T4 is controlled based on the voltage of the switching node $N_{SW}$ (hereinafter, referred to as a first voltage), the voltage of the bias node $N_B$ (hereinafter, referred to as a second voltage) is adjusted (e.g., in response to the state of the fourth transistor T4), the seventh transistor T7 is turned on to provide the second voltage to the gate terminal of the first transistor T1, and thus the first transistor T1 is controlled based on the second voltage so that the first voltage of the switching node $N_{SW}$ may be adjusted. Since the fourth transistor T4, the seventh transistor T7, and the first transistor T1 form a negative loop, the first voltage of the switching node $N_{SW}$ may be maintained at a constant level. In other words, the negative feedback circuit 25 may perform a voltage regulation function of the first voltage. The first transistor T1 may operate as a source follower, and may operate in a saturation region. The first transistor T1 has a high output impedance, and the high output impedance may contribute to the mitigation of the change in the first voltage of the switching node $N_{SW}$.

Figure 4A:
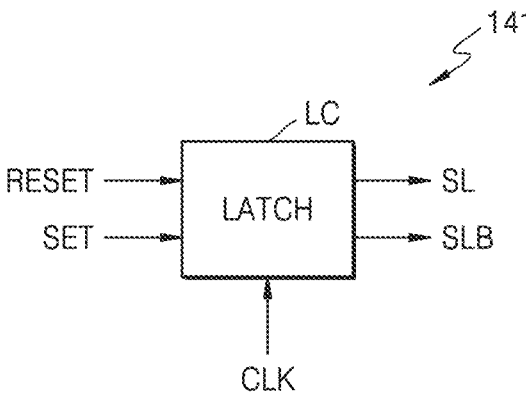
FIG. 4A is a diagram showing a logic circuit for generating control signals provided to a current cell according to an embodiment.
Figure 4B:
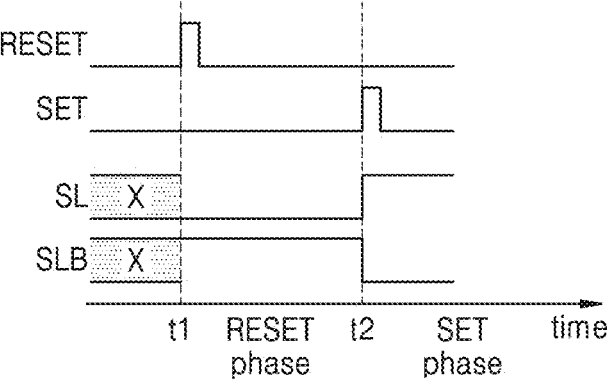
FIG. 4B is a timing diagram of control signals, according to an embodiment.

FIG. 4A is a diagram showing a logic circuit for generating control signals provided to a current cell according to an embodiment, and FIG. 4B is a timing diagram of control signals, according to an embodiment.

The logic circuit 141 may be provided in the ramp signal generator 140 of FIG. 1 and may generate control signals provided to the current cells 20 of FIGS. 3A and 3B of the ramp signal generator 140.

Referring to FIG. 4A, the logic circuit 141 may include a latch LC, and the latch LC may generate a first control signal SLB and a second control signal SL based on a reset signal RESET and a set signal SET.

Referring to FIG. 4B, a reset signal RESET may be toggled between a first level (e.g., logic low) and a second level (e.g., logic high) at a time point t1, and the latch LC may generate a first control signal SLB of a second level and a second control signal SL of a first level in response to the rising (or falling) edge of the reset signal RESET. Thereafter, at a time point t2, the set signal SET may be toggled between the first level and the second level, and the latch LC may generate the first control signal SLB of the first level and the second control signal SL of the second level in response to the rising (or falling) edge of the set signal SET. The period from time point t1 to time point t2 may be referred to as a reset phase, and the period after time point t2 may be referred to as a set phase.

The first level (low level) of each of the first control signal SLB and the second control signal SL may be level-shifted to the voltage level of the first power voltage (VSS in FIGS. 3A and 3B), and the second level (high level) may be level-shifted to the voltage level of the second power voltage (VDDA in FIGS. 3A and 3B).

The first control signal SLB and the second control signal SL described with reference to FIG. 4B may be provided to the first current cell 20 of FIG. 3B. The levels of the first control signal SLB and the second control signal SL may vary according to the types of the first to fourth switches SW1 to SW4 in FIG. 3A. For example, unlike FIG. 3B, when the first and second switches SW1 and SW2 are implemented as N-type transistors and the third and fourth switches SW3 and SW4 are implemented as P-type transistors, the latch LC may generate a first control signal SLB of a first level and a second control signal SL of a second level in a reset phase, and generate the first control signal SLB of the second level and the second control signal SL of the first level in a set phase.

For convenience of explanation, the logic circuit 141 is shown to include one latch LC, in FIG. 4A, but the logic circuit 141 may include N latches LC corresponding respectively to the N current cells 10_1 to 10_N of FIG. 2. For example, one of the N latches LC may be provided for each of the N current cells.

The logic circuit 141 may operate based on a clock signal CLK, and the period from the rising time point (e.g., t1) of the reset signal RESET to the rising time point (e.g., t2) of the set signal SET may correspond to one cycle (or half cycle) of the clock signal CLK. In some embodiments, the logic circuit 141 may continuously shift the initial reset signal RESET and the initial set signal SET by one cycle (or half cycle) of the clock signal CLK over time to generate the reset signal RESET and the set signal SET provided to each of the N latches LC. The N current cells 10_1 to 10_N may be sequentially changed from the reset phase to the set phase according to the corresponding reset signal RESET and the set signal SET, and accordingly, the level of the ramp signal RAMP may be reduced.

The period (or frequency) of the clock signal CLK may be the same as the period (or frequency) of the counting clock signal used by the counter (CNT) 132 of FIG. 1, and the counter (CNT) 132 may increase the counting value whenever the ramp signal RAMP decreases. In other words, the ramp signal generation circuit 140 operates based on the clock signal CLK, the counter (CNT) 132 operates based on the counting clock signal, and the operating frequency of the ramp signal generation circuit 140 and the operating frequency of the counter (CNT) 132 may be the same.

Figure 5A:
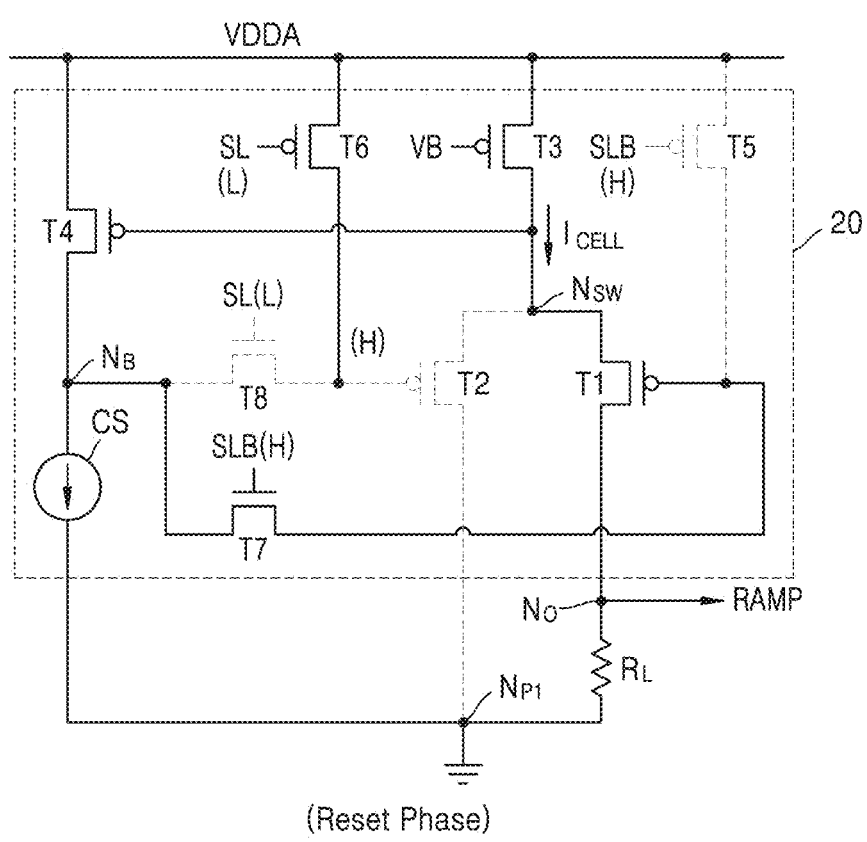
FIGS. 5A and 5B are circuit diagrams respectively illustrating operations in a reset phase and a set phase of a current cell according to some embodiments.
Figure 5B:
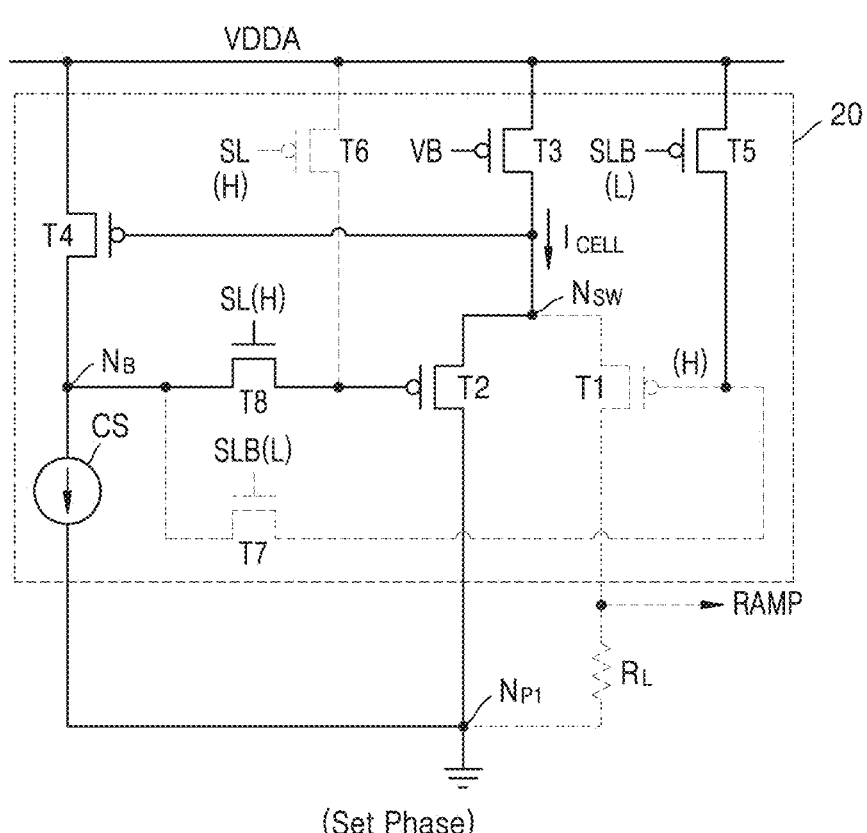

FIGS. 5A and 5B are circuit diagrams illustrating operations in a reset phase and a set phase of a current cell according to an embodiment.

Referring to FIG. 5A, in the reset phase, the fifth transistor T5 is turned off in response to the first control signal SLB of the second level H, and the eighth transistor T8 is turned off in response to the second control signal SL of the first level L. The sixth transistor T6 may be turned on in response to the second control signal SL of the first level L to provide the second power voltage VDDA to the gate terminal of the second transistor T2. The second transistor T2 may be turned off in response to the second power supply voltage VDDA. The seventh transistor T7 may be turned on in response to the first control signal SLB of the second level H to provide the second voltage of the bias node $N_B$ to the gate terminal of the first transistor T1. The first transistor T1 may be turned on based on the second voltage to provide the cell current $I_{CELL}$ to the load resistor $R_L$. As described above with reference to FIG. 3B, the switching node $N_{SW}$, the fourth transistor T4, the seventh transistor T7, and the first transistor T1 form a negative feedback loop, and the first voltage of the switching node $N_{SW}$ may remain unchanged and maintain a constant level. The first transistor T1 may operate in a saturation region and may have a high output impedance. Therefore, even if the level of the ramp signal RAMP changes (e.g., the level decreases), the first voltage does not change and may maintain a constant level.

Referring to FIG. 5B, in the set phase, the sixth transistor T6 is turned off in response to the second control signal SL of the second level H, and the seventh transistor T7 is turned off in response to the first control signal SLB of the first level L. The fifth transistor T5 may be turned on in response to the first control signal SLB of the first level L to provide the second power voltage VDDA to the gate terminal of the first transistor T1. The first transistor T1 may be turned off in response to the second power supply voltage VDDA. The eighth transistor T8 may be turned on in response to the second control signal SL of the first level H to provide the second voltage of the bias node $N_B$ to the gate terminal of the second transistor T2. The second transistor T2 may be turned on based on the second voltage to provide the cell current $I_{CELL}$ to the first power node $N_{P1}$. In the set phase, the switching node $N_{SW}$, the fourth transistor T4, the eighth transistor T8, and the second transistor T2 form a negative feedback loop, and the first voltage of the switching node $N_{SW}$ may be kept constant.

Figure 6:
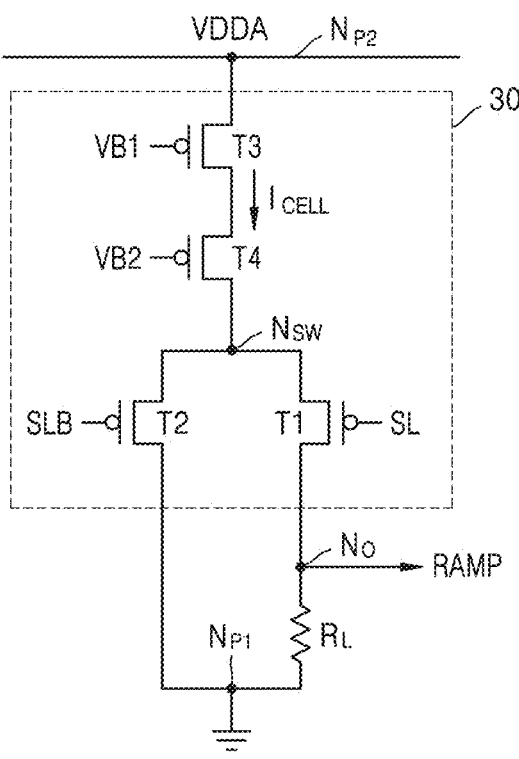
FIG. 6 is a circuit diagram illustrating a current cell according to a comparative example.

FIG. 6 is a circuit diagram illustrating a current cell according to a comparative example.

Referring to FIG. 6, a second current cell 30 according to a comparative example to the first current cell 20 of FIGS. 3A and/or 3B according to an embodiment may include first to fourth transistors T1 to T4.

The first and second transistors T1 and T2 may be referred to as first and second switch transistors, respectively. The first transistor T1 is connected between the switching node $N_{SW}$ and the output node $N_O$, and may be turned on or off in response to the second control signal SL. The first transistor T1 may be turned on to provide the cell current $I_{CELL}$ to the load resistor $R_L$. The second transistor T2 is connected between the switching node $N_{SW}$ and the first power node $N_{P1}$, and may be turned on or off in response to the first control signal SLB. The second transistor T2 may be turned on to provide the cell current $I_{CELL}$ to the first power node $N_{P1}$.

The third transistor T3 and the fourth transistor T4 may be connected in series between the second power node $N_{P2}$ and the switching node $N_{SW}$, and may generate a cell current $I_{CELL}$ based on a first bias voltage VB1 and a second bias voltage VB2.

Figure 7A:
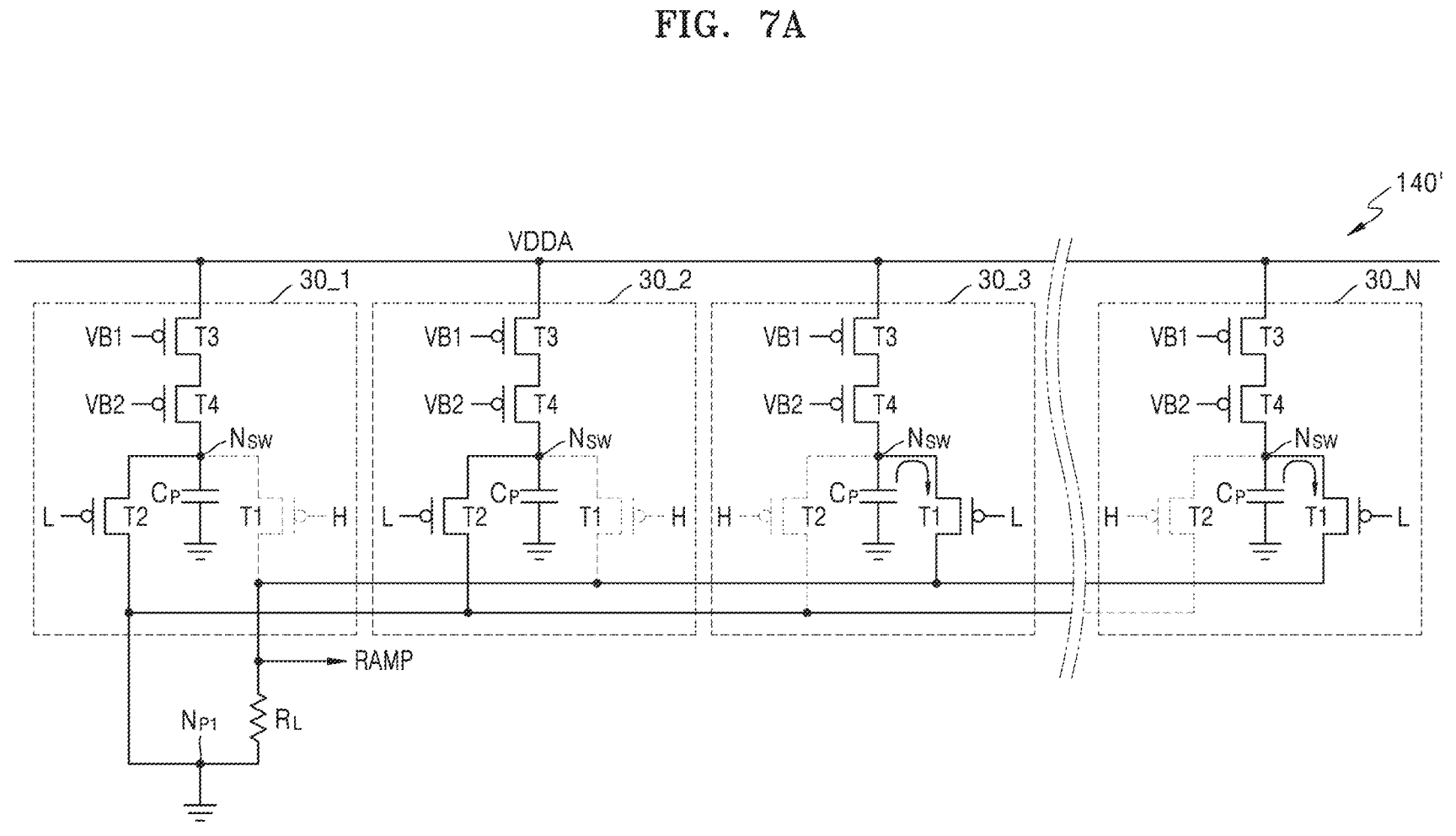
Figure 7B:
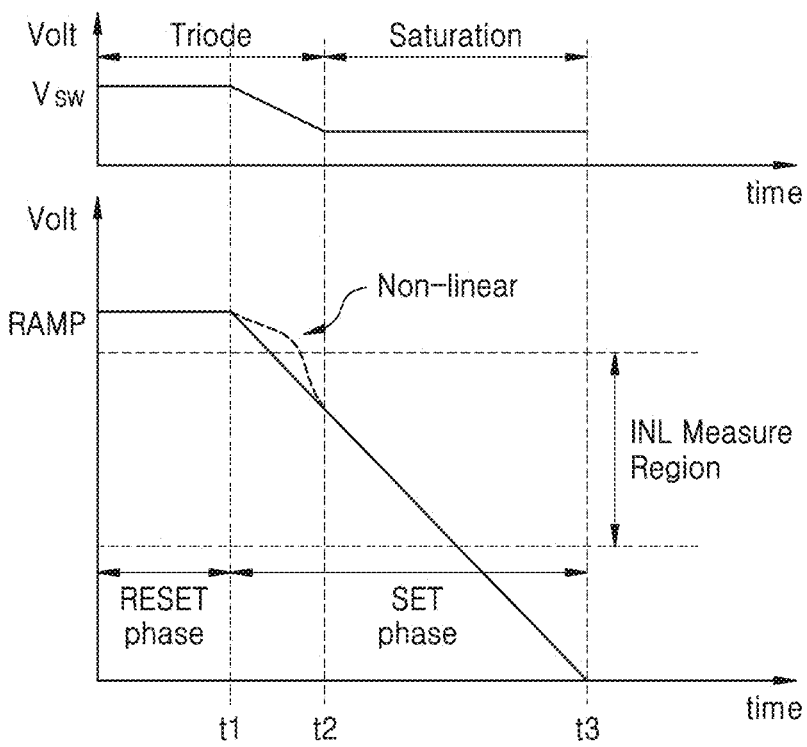
FIG. 7B is a timing diagram of a voltage of a switching node and a ramp signal of a current cell according to a Comparative Example.

FIG. 7A is a circuit diagram showing an operation of a ramp signal generator including current cells according to a Comparative Example, and FIG. 7B is a timing diagram of a voltage of a switching node and a ramp signal of a current cell according to a Comparative Example.

Referring to FIG. 7A, a ramp signal generator 140' may include N cells 30_1 to 30_N, and the N cells 30_1 to 30_N may be implemented as the second current cell 30 (see FIG. 6) according to a comparative example. A parasitic capacitor $C_P$ may be formed at the switching node $N_{SW}$ of each of the N cells 30_1 to 30_N.

The N cells 30_1 to 30_N may sequentially be changed from a reset phase to a set phase, and accordingly, the level of the ramp signal RAMP may be reduced. For example, the first cell 30_1 to the Nth cell 30_N may be sequentially changed from a reset phase to a set phase.

Referring to FIG. 7B together, before the ramping operation of the ramp signal generator 140', for example, before time point t1, the first to Nth cells 30_1 to 30_N may operate in a reset phase, and may provide a cell current to the load resistor $R_L$. The ramping operation starts from the time point t1, and the first to Nth cells 30_1 to 30_N may be sequentially changed from the reset phase to the set phase.

As shown in FIG. 7A, the first and second cells 30_1 and 30_2 may operate in the set phase, and the third to Nth cells 30_3 to 30_N may operate in the reset phase at the beginning of the ramping operation. The first and second cells 30_1 and 30_2 may provide cell current to the first power node $N_{P1}$, and the third to Nth cells 30_3 to 30_N may provide cell current to the load resistor $R_L$. When the ramping operation starts, the level of the ramp signal RAMP may be lowered as the amount of current flowing through the load resistor $R_L$ decreases.

As shown in FIG. 7B, the first transistors T1 of the second cells in the reset phase, for example, the third to Nth cells 30_3 to 30_N, operate in a triode region, and as the level of the ramp signal RAMP decreases, the first voltage $V_{SW}$ of the switching node $N_{SW}$ also decreases. Since the first voltage $V_{SW}$ of the switching node $N_{SW}$ is also lowered, the charge charged in the parasitic capacitor $C_P$ is discharged and flows through the load resistor $R_L$. Accordingly, an error occurs in the level of the ramp signal RAMP. As shown in FIG. 7B, the level of the ramp signal RAMP may be decreased nonlinearly in the initial period of the ramping operation from the time point t1 to the time point t2, and may be higher than the level of the ideal ramp signal RAMP. As a result, the ramp signal RAMP shows nonlinearity in the INL measurement section (or the INL measurement region or INL measurement period), and thus the INL characteristics may be deteriorated.

Thereafter, as the ramp signal RAMP is further lowered, the first transistor T1 may be operated in the saturation region from a time point t2. Thus, after the time point t2, even if the voltage of the ramp signal RAMP changes as the output impedance of the first transistor T1 increases, the first voltage $V_{SW}$ of the switching node $N_{SW}$ may not change and may be kept constant. Accordingly, after the time point t2, discharge of the parasitic capacitor $C_P$ does not occur, and the level of the ramp signal RAMP may be linearly reduced.

However, as described above, in the ramp signal generator 140' including the second current cell (30 of FIG. 6) according to the comparative example, an error occurs in the ramp signal at the beginning of the ramping operation (i.e., from time point t1 to time point t2, thereby deteriorating the INL characteristics. As the capacitance of the parasitic capacitor CP increases, the deterioration of the INL characteristics may increase, and as the operating frequency of the ramping signal generator 140', for example, the frequency of the clock signal may become high, the deterioration of the INL characteristics may increase.

Figure 8A:
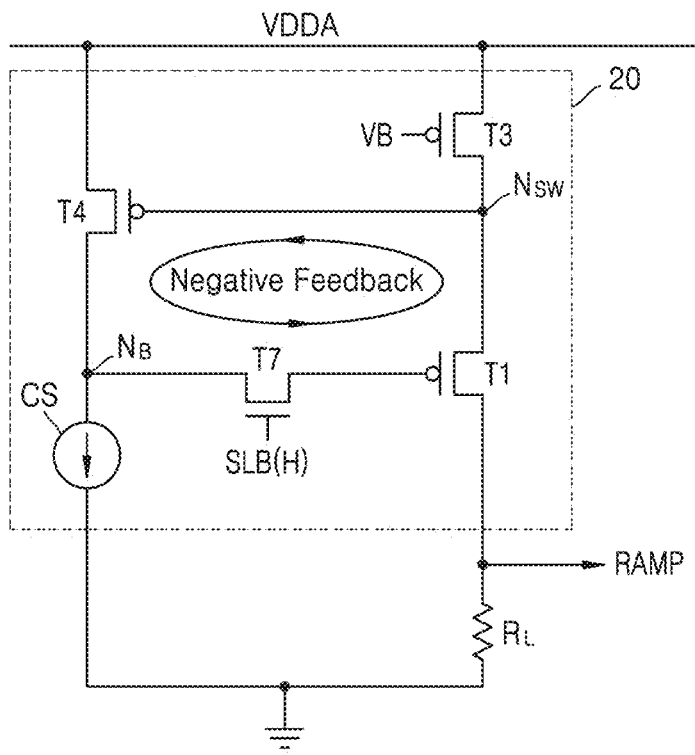
FIG. 8A is a circuit diagram illustrating a negative feedback loop when a current cell according to an embodiment operates in a reset phase according to an embodiment.
Figure 8B:
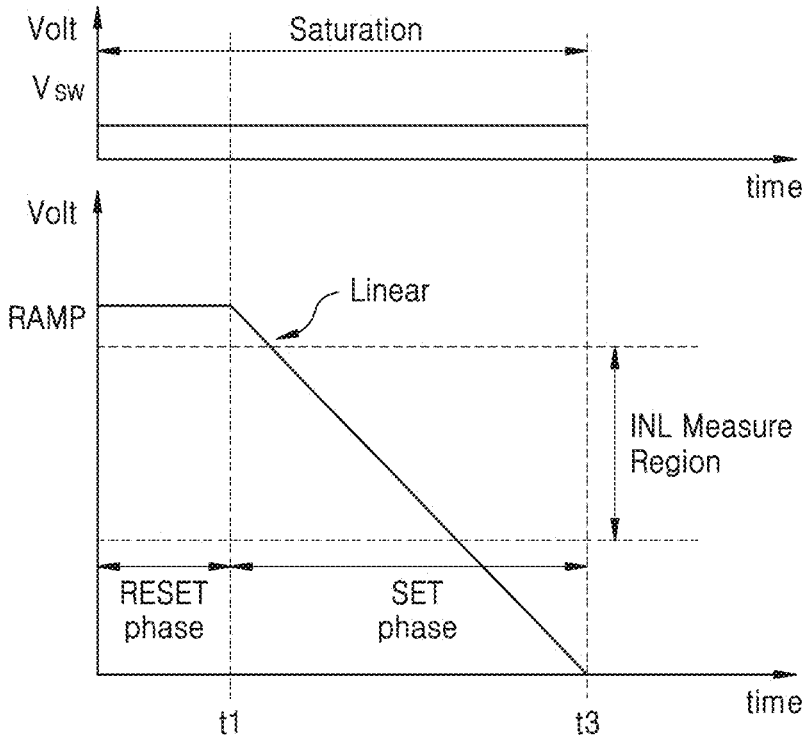
FIG. 8B is a timing diagram of a voltage of a switching node and a ramp signal of a current cell, according to an embodiment.

FIG. 8A is a circuit diagram illustrating a negative feedback loop when a current cell according to an embodiment operates in a reset phase, according to an embodiment, and FIG. 8B is a timing diagram of a voltage of a switching node and a ramp signal of a current cell, according to an embodiment.

The first current cell 20 according to an embodiment may be implemented as the first current cell 20 of FIGS. 3A and/or 3B, and transistors not shown in FIG. 8A are in an off state.

Referring to FIG. 8A, in the reset phase, the switching node $N_{SW}$, the fourth transistor T4, the bias node $N_B$, the seventh transistor T7, and the first transistor T1 form a negative feedback loop, and the first transistor T1 may operate in the saturation region.

As illustrated in FIG. 8B, the first transistor T1 may always operate in the saturation region. For example, the first transistor T1 may operate in the saturation region in the reset phase and the set phase. Even at the initial stage of the ramping operation (i.e., from time point t1), since the first transistors T1 provided in the first current cell 20 in the reset phase operate in the saturation region, the voltage of the switching node $N_{SW}$ does not change even if the level of the ramp signal RAMP is reduced. A parasitic capacitor ($C_P$ of FIG. 7A) may be formed at the switching node $N_{SW}$ in the first current cell 20. However, since the voltage of the switching node $N_{SW}$ does not change, there is no error in the level of the ramp signal RAMP due to the discharge of the parasitic capacitor $C_P$. Accordingly, the ramp signal RAMP shows linearity in the INL measurement period of the ramp signal RAMP, and the INL characteristics may be improved.

Figure 9A:
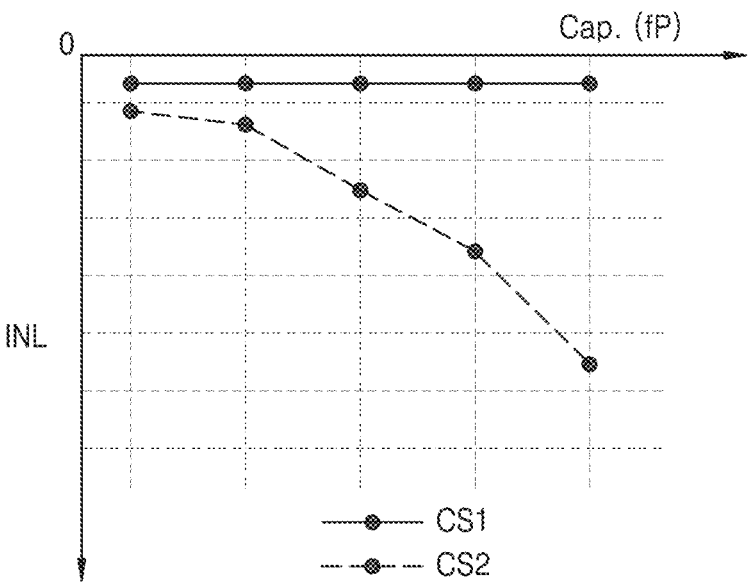
FIGS. 9A and 9B are graphs comparing changes in integral non-linearity (INL) characteristics of a current cell according to an embodiment and a current cell according to a Comparative Example, respectively.
Figure 9B:
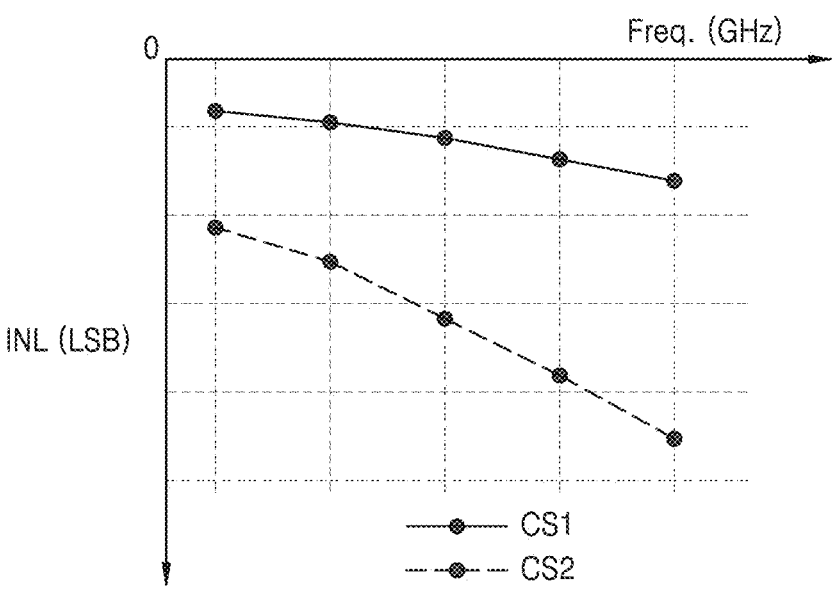

FIGS. 9A and 9B are graphs comparing changes in INL characteristics of a current cell according to an embodiment and a current cell according to a Comparative Example. FIG. 9A shows a change in INL characteristics according to an increase in the capacitance of the parasitic capacitor of the switching node of the current cell, and FIG. 9B shows a change in INL characteristics according to an increase in the frequency of the clock signal.

Referring to FIG. 9A, the horizontal axis represents the capacitance Cap. of the parasitic capacitor $C_P$, and the capacitance Cap. may be several to tens of fF (femto farad). The vertical axis represents INL.

In the first current cell CS1 according to an embodiment, although the capacitance of the parasitic capacitor is increased, there is a little change in the INL characteristics. By contrast, INL characteristics of the second current cell CS2 according to the comparative example may deteriorate as the capacitance of the parasitic capacitor increases. Therefore, it may be seen that the INL characteristics of the second current cell CS2 according to the comparative example are deteriorated by the discharge of the parasitic capacitor $C_P$, while the INL characteristics of the first current cell CS1 according to the embodiment are hardly affected by the discharge of the parasitic capacitor $C_P$.

Referring to FIG. 9B, the horizontal axis represents a frequency Freq. of the clock signal CLK of FIG. 4A, and the frequency may be several GHz (gigahertz). The vertical axis represents INL. FIG. 9B illustrates a change in INL characteristics according to a change in a frequency of a clock signal in a condition in which a load capacitor is not present.

As the frequency of the clock signal increases, the INL characteristic may deteriorate. The INL characteristics of the second current cell CS2 according to Comparative Example may be significantly degraded compared to the first current cell CS1 according to an embodiment. For example, when the INL characteristics are deteriorated by about 0.3 Least Significant Bit (LSB) as the frequency of the clock signal increases in the first current cell CS1 according to an embodiment, the INL characteristics of the second current cell CS2 according to the comparative example may be deteriorated by 1 LSB or more as the frequency of the clock signal increases. Thus, the first current cell CS1 according to an embodiment may have improved INL characteristics in a high-speed operation.

As described above, the first current cell CS1 according to an embodiment may have a large output impedance by operating the first switch transistor T1 in a saturation region and generating a cell current based on a gain-boosted cascade method including a negative feedback loop circuit. Accordingly, the INL characteristics of the ramp signal RAMP are not affected by the parasitic capacitor, and the INL characteristics may be improved in a high-speed operation. In some embodiments, unlike the second current cell CS2, the first current cell CS1 may have a single bias transistor. Since the number of transistor stacks decreases, the ramp signal generator 140 including the first current cells CS1 may operate at a low voltage. Accordingly, the image sensor (100 in FIG. 1) including the ramp signal generator 140 according to an embodiment may improve image quality and reduce power consumption even during high-speed operation.

Figure 10:
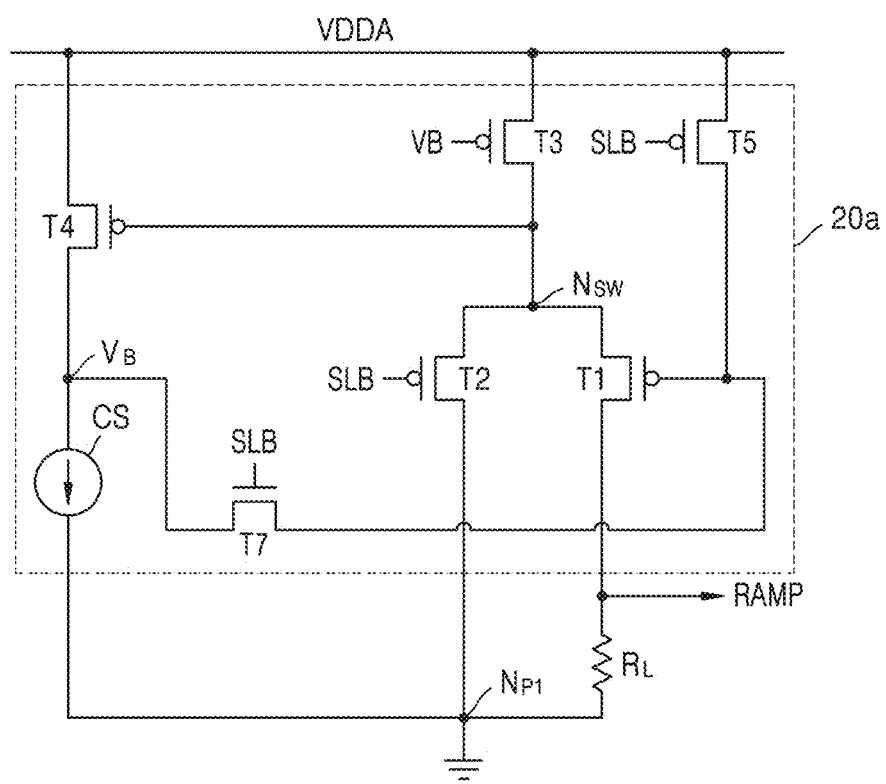
FIG. 10 is a circuit diagram illustrating a current cell according to an embodiment.

FIG. 10 is a circuit diagram illustrating a current cell according to an embodiment.

The first current cell 20a of FIG. 10 is a modified example of the first current cell 20 of FIGS. 3A and 3B. Therefore, redundant explanations will be omitted for conciseness and the differences will be mainly explained.

Referring to FIG. 10, a first control signal SLB may be applied to the gate terminal of the second transistor T2. The second transistor T2 may be turned off in response to the first control signal SLB of the second level in the reset phase, and may be turned on in response to the first control signal SLB of the first level in the set phase.

In the reset phase, as described with reference to FIG. 5A, the second transistor T2 is turned off, and the first transistor T1 is turned on to provide the cell current $I_{CELL}$ to the load resistor $R_L$, and the first transistor T1, the fourth transistor T4, and the seventh transistor T7 may form a negative feedback loop. In the set phase, the first transistor T1 is turned off, and the second transistor T2 is turned on to directly provide the cell current $I_{CELL}$ to the first power node $N_{P1}$, for example, the ground. Unlike the description of FIG. 5B, in the first current cell 20a of FIG. 10, a negative feedback loop may not be formed in the set phase. Since the first transistor T1 is turned off in the set phase, even if the level of the ramp signal RAMP is reduced, the voltage of the switching node $N_{SW}$ is not affected.

Figure 11:
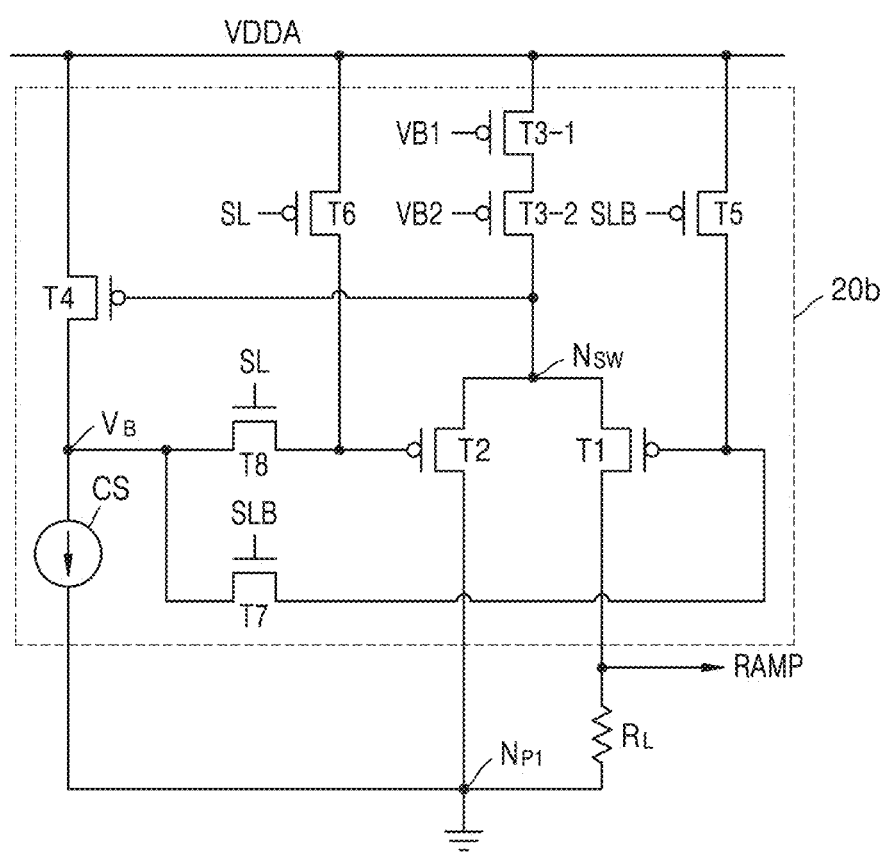
FIG. 11 is a circuit diagram illustrating a current cell according to an embodiment.

FIG. 11 is a circuit diagram illustrating a current cell according to an embodiment.

The first current cell 20b of FIG. 11 is a modified example of the first current cell 20 of FIGS. 3A and 3B. Therefore, redundant explanations will be omitted for conciseness and the differences will be mainly explained.

Referring to FIG. 11, a first current cell 20b may include a plurality of third transistors, for example, two third transistors T3-1 and T3-2. The two third transistors T3-1 and T3-2 may generate a cell current based on a first bias voltage VB1 and a second bias voltage VB2, respectively. As the number of transistor stacks increases, the output impedance of the first current cell 20b may increase.

Figure 12:
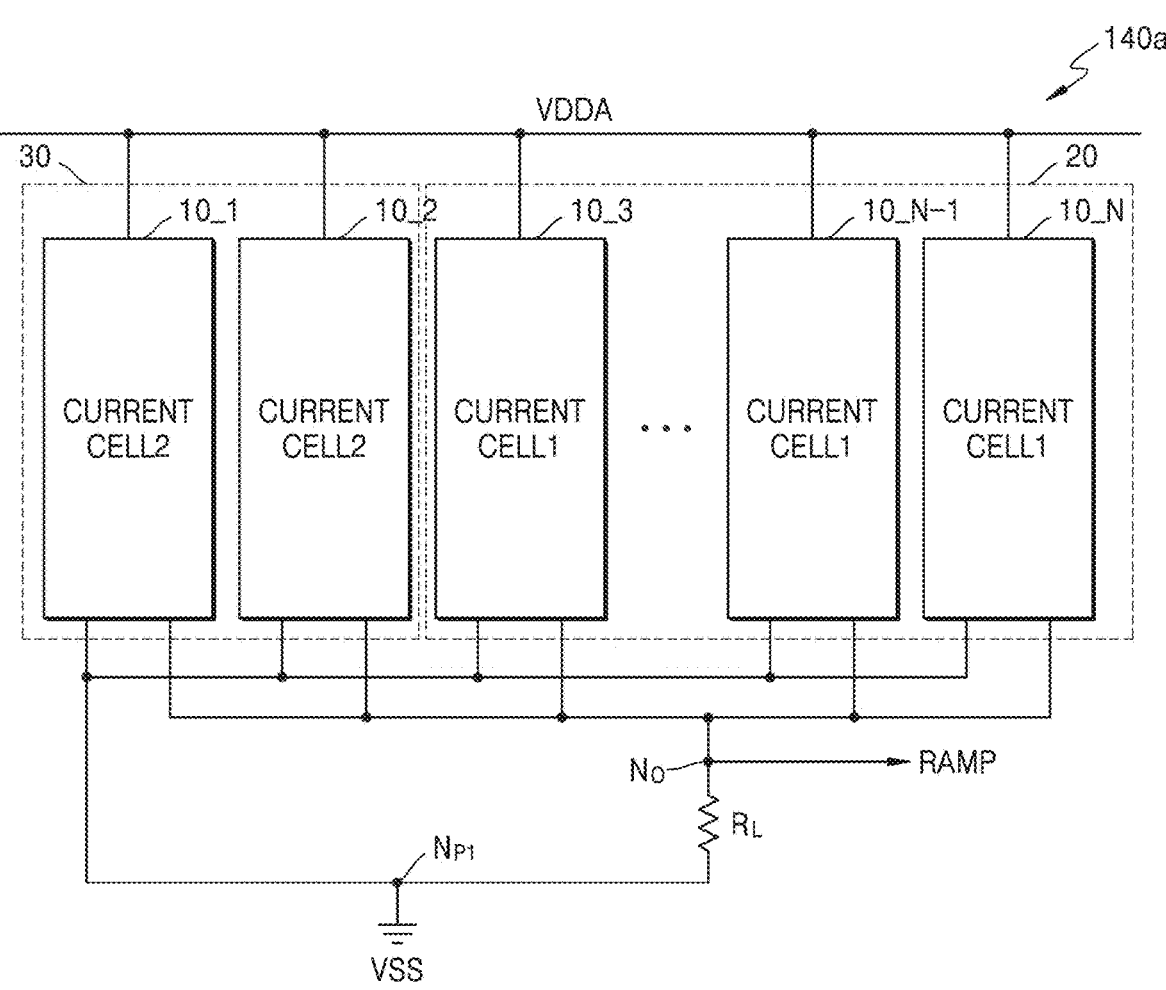
FIG. 12 is a circuit diagram illustrating a ramp signal generator according to an embodiment.

FIG. 12 is a circuit diagram illustrating a ramp signal generator according to an embodiment.

The ramp signal generator 140a of FIG. 12 is a modified example of the ramp signal generator 140 of FIG. 2. Therefore, redundant explanations will be omitted for conciseness and the differences will be mainly explained.

Referring to FIG. 12, a ramp signal generator 140a may include a plurality of current cells, for example, first to Nth current cells 10_1 to 10_N, and at least one current cell may be implemented as a first current cell (20 in FIGS. 3A and 3B, or 20a in FIG. 10 or 20b in FIG. 11) including a negative feedback circuit 25, and at least another current cell may be implemented as a second current cell (30 in FIG. 6).

For example, as illustrated in FIG. 12, the first and second current cells 10_1 and 10_2 may be implemented as a second current cell (current cell2) 30, and the third to Nth current cells 10_3 to 10_N may be implemented as a first current cell (current cell1) 20. The first and second current cells 10_1 and 10_2 may be changed from a reset phase to a set phase earlier than the third to Nth current cells 10_3 to 10_N. For example, the first and second current cells 10_1 and 10_2 may be in the set phase in the initial stage of the ramping period, and the third to Nth current cells 10_3 to 10_N may be in the reset phase in the initial stage of the ramping period. The first transistor T1 provided in each of the third to Nth current cells 10_3 to 10_N may operate in the saturation region, and even when the level of the ramp signal RAMP is decreased, the voltage of the switching node $N_{SW}$ may be kept constant. Accordingly, linearity of the ramp signal RAMP is maintained, and INL characteristics may be improved.

Figure 13:
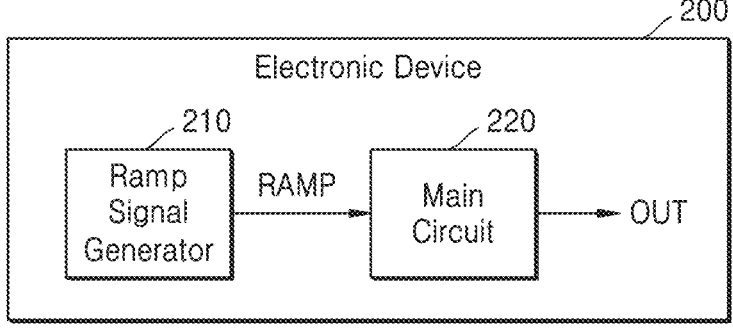
FIG. 13 is a schematic block diagram of an electronic device according to an embodiment.

FIG. 13 is a schematic block diagram of an electronic device according to an embodiment.

The electronic device 200 may refer to any device configured to perform a desired function using electrical energy, and may be referred to as an electrical system. For example, the electronic device 200 may be composed of a semiconductor chip manufactured by a semiconductor process, a module including a board and at least one semiconductor chip mounted on the board, or two or more modules that communicate with each other. In some embodiments, the electronic device 200 may be an independently used unit such as a mobile phone, or a component of the entire system such as a vehicle.

Referring to FIG. 13, the electronic device 200 may include a ramp signal generator 210 and a main circuit 220.

The ramp signal generator 210 may be implemented as any one of the ramp signal generator 140 and 140a of FIGS. 1, 2, and 12. The ramp signal generator 210 may include a load resistor and a plurality of current cells, at least one or all of the plurality of current cells may include a negative feedback loop circuit, and the voltage of the switching node may not change even if the level of the ramp signal RAMP is lowered. Accordingly, the ramp signal RAMP has linearity, and INL characteristics may be improved.

The main circuit 220 may be designed to provide at least one of the functions provided by the electronic device 200 or a main function provided by the electronic device 200. The main circuit 220 may output a function provided by the electronic device 200 to the outside as an output signal OUT. For example, the main circuit 220 may include an analog circuit such as an analog filter, an amplifier, etc., a digital circuit that processes a digital signal, or a circuit that processes a mixed signal such as an analog-to-digital converter or a digital-to-analog converter.

According to an embodiment, the main circuit 220 may perform a predefined function by detecting data based on the ramp signal RAMP. For example, the main circuit 220 may be a CDS circuit that performs correlated double sampling (CDS) on data based on a ramp signal RAMP, or an analog-to-digital converting circuit that includes a CDS function. In some embodiments, the main circuit 220 may provide various functions using a ramp signal RAMP whose level has a constant slope and gradually increases or decreases.

Figure 14:
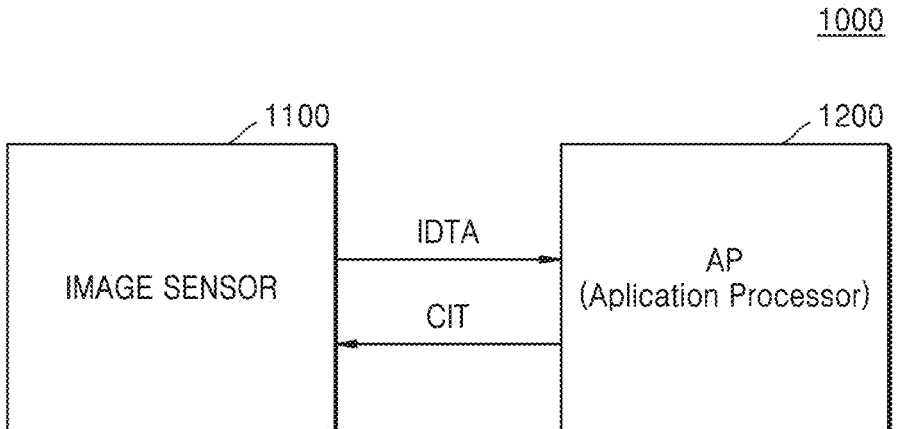
FIG. 14 is a block diagram schematically illustrating an electronic device including an image sensor according to an embodiment.

FIG. 14 is a block diagram schematically illustrating an electronic device including an image sensor according to embodiments.

Referring to FIG. 14, an electronic device 1000 may include an image sensor 1100 and an application processor (AP) 1200. The electronic device 1000 may further include various sensors such as an illuminance sensor, a communication module, and the like.

The AP 1200 may provide control signals CIT for controlling the operation of the image sensor 1100 to the image sensor 1100. Transmission of the control signals CIT may be performed based on, for example, an interface based on an inter-integrated circuit (I2C). The control signals CIT may also further include configuration data of the image sensor 1100, such as a lens shading correction value, a crosstalk coefficient, an analog gain, a digital gain, a frame rate setting value, and the like.

The image sensor 1100 may generate image data IDTA by photographing an object based on the received control signals. The image data IDTA may include a still image and a moving image. The image sensor 1100 may perform signal processing such as one or more of image quality compensation, binning, and down-sizing on the image data IDTA, and the image quality compensation may include, for example, signal processing such as one or more of black level compensation, lens shading compensation, crosstalk compensation, and bad pixel compensation.

The image sensor 100 described with reference to FIG. 1 may be applied as the image sensor 1100. The ramp signal generator (140 in FIG. 1) provided in the image sensor 100 may include a load resistor and a plurality of current cells that provide a cell current to the load resistor or a first power node, for example, a ground, and at least some or all of the plurality of current cells may be implemented as a first current cell (20 in FIGS. 3A and 3B, 20a in FIG. 10, or 20b in FIG. 11) including a negative feedback loop circuit. Accordingly, the INL characteristics of the ramp signal RAMP may be improved, and degradation of the INL characteristics of the ramp signal RAMP may be improved when the ramp signal generator 140 operates at a high speed. Therefore, even if the image sensor 1100 operates at a high speed, image quality deterioration of the image data IDTA generated by the image sensor 1100 may be prevented.

For example, when the frame rate of the image sensor 1100 increases or the image sensor 1100 generates, in one frame, a first image and a second image with different luminance used to generate a High Dynamic Range (HDR) image, the ramp signal generator 140 may operate at high speed. When the INL characteristics of the ramp signal RAMP is deteriorated during the high-speed operation of the ramp signal generator 140, the image quality of the image generated by the image sensor 1100 may be deteriorated. However, as described above, the ramp signal generator 140, according to the embodiment, does not deteriorate the INL characteristics of the ramp signal RAMP even during high-speed operation, and thus, image quality deterioration may be prevented.

The image sensor 1100 may transmit image data IDTA or signal-processed image data IDTA to the AP 1200. In an embodiment, the image sensor 1100 may transmit a plurality of pieces of image data having different luminance, for example, image data IDTA including first image data and second image data, to the AP 1200.

The transmission of the image data IDTA may be performed using, for example, a camera serial interface (CSI) based on a Mobile Industry Processor Interface (MIPI), but embodiments are not limited thereto.

The application processor 1200 may perform image processing on the received image data IDTA, such as one or more of bad pixel correction, 3A adjustment including auto-focus correction, auto-white balance, and auto-exposure, noise reduction, sharpening, gamma control, remosaic, demosaic, and resolution scaling (video/preview).

In some embodiments, the application processor 1200 may generate a high dynamic range (HDR) image based on multiple image data with different luminance, such as first image data and second image data.

While various embodiments have been particularly shown and described with reference to the drawings, it will be understood that various changes in form and details may be made therein without departing from the spirit and scope of the following claims.

What is claimed is:

1. A ramp signal generator comprising:
   a resistor connected between an output node outputting a ramp signal that increases or decreases at a constant slope and a first power node which is configured to receive a first power voltage; and
   a plurality of current cells, a cell current flowing through each of the plurality of current cells to the first power node or the resistor, the plurality of current cells including at least one first current cell,
   wherein the at least one first current cell comprises:
      a first transistor connected between a first switching node and the output node, the cell current flowing to the resistor through the first transistor;
      a second transistor connected between the first switching node and the first power node, the cell current flowing to the first power node through the second transistor; and
      a negative feedback circuit that maintains a constant voltage at the first switching node by controlling a gate terminal of the first transistor based on a voltage of the first switching node.

2. The ramp signal generator of claim 1, wherein the negative feedback circuit comprises:
   a load transistor including a first terminal connected to a second power node which is configured to receive a second power voltage, a second terminal connected to a bias node, and a gate terminal connected to the first switching node;
   a current source connected between the bias node and the first power node;
   a first switch connected to the bias node and the gate terminal of the first transistor, the first switch being turned on or off based on a first control signal; and
   a second switch connected to the bias node and a gate terminal of the second transistor, the second switch being turned on or off based on a second control signal that is a complementary signal of the first control signal.

3. The ramp signal generator of claim 2, wherein the at least one first current cell further comprises:
   a bias transistor connected between the second power node and the first switching node, the bias transistor generating the cell current;
   a third switch connected between the second power node and the gate terminal of the first transistor, the third switch being turned on based on the first control signal to turn off the first transistor; and
   a fourth switch connected between the second power node and the gate terminal of the second transistor, the fourth switch being turned on based on the second control signal to turn off the second transistor.

4. The ramp signal generator of claim 3, wherein, in a reset phase, the second transistor is turned off, and the first transistor is turned on to provide the cell current to the resistor.

5. The ramp signal generator of claim 4, wherein the first transistor operates in a saturation region.

6. The ramp signal generator of claim 4, wherein, in a set phase after the reset phase, the first transistor is turned off, and the second transistor is turned on to provide the cell current to the first power node.

7. The ramp signal generator of claim 6, wherein:
   in the reset phase, the first switch and the fourth switch are turned on, and the second switch and the third switch are turned off, and
   in the set phase, the first switch and the fourth switch are turned off, and the second switch and the third switch are turned on.

8. The ramp signal generator of claim 2, wherein:
   the first power voltage is less than the second power voltage, and
   each of the first transistor and the second transistor includes a P-type transistor.

9. The ramp signal generator of claim 1, wherein:
   the plurality of current cells are sequentially changed from a reset phase to a set phase, and
   the first transistor provided in the at least one first current cell in the reset phase among the plurality of current cells operate in a saturation region and provide the cell current to the resistor.

10. The ramp signal generator of claim 1, wherein each of the plurality of current cells includes the first current cell.

11. The ramp signal generator of claim 1, wherein the plurality of current cells include the at least one first current cell and at least one second current cell, wherein the at least one second current cell comprises:
    a bias transistor connected between a second power node which is configured to receive a second power voltage and a second switching node, the bias transistor generating the cell current;
    a third transistor connected between the second switching node and a first terminal of the resistor, the cell current flowing to the resistor through the third transistor; and
    a fourth transistor connected between the second switching node and the first power node, the cell current flowing to the first power node through the fourth transistor.

12. The ramp signal generator of claim 11, wherein:
    a level of the ramp signal decreases as the plurality of current cells are sequentially changed from a reset phase to a set phase;
    in the reset phase, the first transistor and the third transistor are turned on, and the second transistor and the fourth transistor are turned off;
    in the set phase, the second transistor and the fourth transistor are turned on, and the first transistor and the third transistor are turned off; and
    the at least one second current cell is changed to the set phase earlier than the at least one first current cell.

13. An image sensor comprising:
    a pixel array including a plurality of pixels;
    a ramp signal generation circuit configured to generate a ramp signal of which a level decreases at a constant slope; and
    an analog-to-digital conversion circuit configured to convert a pixel signal provided from the pixel array into a pixel value based on the ramp signal,
    wherein the ramp signal generation circuit includes:
       a load resistor connected between a ground and an output node to which the ramp signal is output, and a plurality of current cells, each providing a cell current to the load resistor during a reset period and providing the cell current to the ground during a set period, and wherein each of the plurality of current cells includes:

a first transistor connected between a switching node and the output node, the cell current flowing to the load resistor through the first transistor, a second transistor connected between the switching node and the ground, the cell current flowing to the ground through the second transistor, and a negative feedback circuit that controls a gate terminal of the first transistor based on a voltage of the switching node so that the first transistor operates in a saturation region.

14. The image sensor of claim 13, wherein the negative feedback circuit comprises:

a third transistor including a first terminal which is configured to receive a positive power voltage, a second terminal connected to a bias node, and a gate terminal connected to the switching node;

a current source connected between the bias node and the ground;

a fourth transistor connected to the bias node and the gate terminal of the first transistor, the fourth transistor being turned on or off based on a first control signal; and a fifth transistor connected to the bias node and a gate terminal of the second transistor, the fifth transistor being turned on or off based on a second control signal that is a complementary signal of the first control signal.

15. The image sensor of claim 13, wherein the negative feedback circuit is further configured to control the gate terminal of the first transistor based on the voltage of the switching node to keep the voltage of the switching node constant.

16. The image sensor of claim 13, wherein each of the plurality of current cells further comprises:

a sixth transistor connected between the switching node and a power node which is configured to receive a positive power voltage, the sixth transistor being configured to generate the cell current;

a seventh transistor connected between the power node and the gate terminal of the first transistor, the seventh transistor configured to turn off the first transistor by providing the positive power voltage to the gate terminal of the first transistor during a set phase; and an eighth transistor connected between the power node and the gate terminal of the second transistor, the eighth transistor being turned on based on a second control signal of a second level to turn off the second transistor by providing the positive power voltage to the gate terminal of the second transistor during a reset phase.

17. The image sensor of claim 13, wherein the plurality of current cells are sequentially changed from a reset phase to a set phase to reduce the level of the ramp signal.

18. An electronic device comprising:

a ramp signal generator that includes a plurality of current cells and a load resistor, the ramp signal generator being configured to control the plurality of current cells to reduce an amount of current flowing through the load resistor and to generate a ramp signal of which a level increases or decreases at a certain slope; and a main circuit configured to perform at least one predefined function by detecting data based on the ramp signal, wherein each of the plurality of current cells includes:

a first transistor connected between a switching node and an output node, a cell current flowing to the load resistor through the first transistor during a reset period, a second transistor connected between the switching node and a ground, the cell current flowing to the ground through the second transistor during a set period, and a negative feedback circuit that controls a gate terminal of the first transistor based on a voltage of the switching node so that the first transistor operates in a saturation region.

19. The electronic device of claim 18, wherein the negative feedback circuit comprises:

an amplifier comprising a single stage controlled based on the voltage of the switching node; and a switch that is turned on during the reset period, the switch being configured to provide an output of the amplifier to the gate terminal of the first transistor.

20. The electronic device of claim 19, wherein the amplifier comprises:

a third transistor including a first terminal which is configured to receive a positive power voltage, a second terminal connected to a bias node, and a gate terminal connected to the switching node; and a current source connected between the bias node and the ground, and wherein the voltage of the bias node is provided to the gate terminal of the first transistor as the output of the amplifier.

* * * * *